US009817097B2

(12) United States Patent
van Beek et al.

(10) Patent No.: US 9,817,097 B2
(45) Date of Patent: Nov. 14, 2017

(54) SHIMMING PROCEDURE THAT INCLUDES DETERMINATION OF THE TARGET FIELD BY OPTIMIZATION IN A PARAMETER SPACE OF REDUCED DIMENSIONALITY

(71) Applicant: BRUKER BIOSPIN AG, Faellanden (CH)

(72) Inventors: Jacco Douwe van Beek, Volketswil (CH); Thomas Speck, Thalwil (CH)

(73) Assignee: Bruker BioSpin AG, Faellanden (CH)

( * ) Notice: Subject to any disclaimer, the term of this patent is extended or adjusted under 35 U.S.C. 154(b) by 539 days.

(21) Appl. No.: 14/493,407

(22) Filed: Sep. 23, 2014

(65) Prior Publication Data

US 2015/0102809 A1   Apr. 16, 2015

(30) Foreign Application Priority Data

Oct. 16, 2013  (DE) .......................... 10 2013 220 933

(51) Int. Cl.
*G01V 3/00* (2006.01)
*G01R 33/44* (2006.01)
(Continued)

(52) U.S. Cl.
CPC ....... *G01R 33/443* (2013.01); *G01R 33/3875* (2013.01); *G01R 33/46* (2013.01); *G01R 33/58* (2013.01)

(58) Field of Classification Search
USPC ........................................................ 324/309
See application file for complete search history.

(56) References Cited

U.S. PATENT DOCUMENTS 3,287,630 A    11/1966   Gang
4,654,595 A *   3/1987   Sepponen ............ G01R 33/482
                                            324/307
(Continued)

FOREIGN PATENT DOCUMENTS

EP     1 662 270       5/2006
EP     2 506 026      10/2012
(Continued)

OTHER PUBLICATIONS

Weiger, Markus et al., "Gradient shimming with spectrum optimisation", Journal of Magnetic Resonance 182 (2006) 38-48.
(Continued)

*Primary Examiner* — Rodney Fuller
(74) *Attorney, Agent, or Firm* — Paul Vincent

(57) ABSTRACT

A method for homogenizing the static magnetic field with a distribution B0(r) in the active volume of a magnetic resonance apparatus having a number N of shim coils defines a target field distribution B0T(r) using a filter method in which a norm of the shim currents is influenced by means of filter factors. An optimization procedure works in a parameter space having M control parameters, wherein $2 \leq M < N$. One of the control parameters is used as a weighting parameter for modification of a spatial weighting function and another control parameter is used to control the filter factors. Using this method the hardware limitations can be taken into account when determining the target field distribution, without a significant increase in the computational effort to determine the target field distribution during optimization.

10 Claims, 8 Drawing Sheets

(51) Int. Cl.
*G01R 33/3875* (2006.01)
*G01R 33/46* (2006.01)
*G01R 33/58* (2006.01)

(56) References Cited

U.S. PATENT DOCUMENTS

| | | | |
|---|---|---|---|
| 4,899,109 A * | 2/1990 | Tropp | G01R 33/56 324/319 |
| 5,371,465 A * | 12/1994 | Onodera | G01R 33/3875 324/307 |
| 6,529,002 B1 | 3/2003 | Kim | |
| 7,348,775 B2 * | 3/2008 | Weiger | G01R 33/3875 324/307 |
| 2007/0164744 A1 | 7/2007 | Kuhara | |
| 2008/0116894 A1 | 5/2008 | Weiger | |
| 2011/0089943 A1 | 4/2011 | Abe | |
| 2013/0030749 A1 | 1/2013 | Nishiyama | |
| 2015/0077107 A1 | 3/2015 | Sharp | |

FOREIGN PATENT DOCUMENTS

| | | |
|---|---|---|
| EP | 2 551 693 | 1/2013 |
| JP | 06109822 | 4/1994 |
| JP | 08316031 | 11/1996 |
| JP | 2004073660 | 3/2004 |
| JP | 2007209749 | 8/2007 |
| JP | 2011229632 | 11/2011 |
| WO | WO 2015005109 | 1/2015 |

OTHER PUBLICATIONS

Wen, Han et al., "An in Vivo Automated Shimming Method Taking into Account Shim Current Constraints", MRM, 34-896-904, (1995).

Ernst, Richard R., "Measurement and Control of Magnetic Field Homogeneity", The Review of Scientific Instruments, vol. 39, No. 7.

Hansen, P.C., "Rank-Deficient and Discrete Ill-Posed Problems", Siam, 99-111; 178-193, (1998).

Kim, D.-H. et al., "Regularized Higher-Order in Vivo . . . ", Magnetic resonance in medicine, 2002, vol. 48, Pa. 715-722.

Liviu Marin et al., "Numerical solution for an inverse . . . ", Engineering Analysis with Boundary Elements 32 (2008), Pa. 658-675.

* cited by examiner

State of the Art  Fig. 2

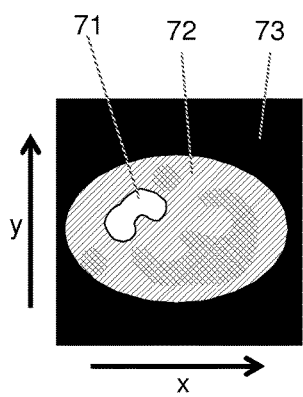
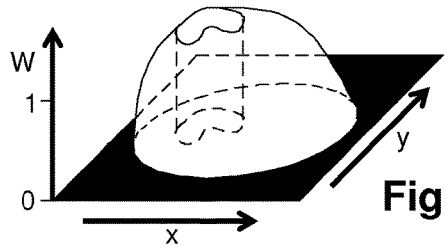
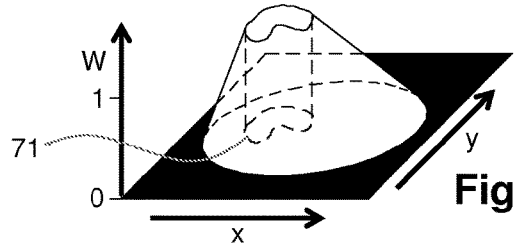
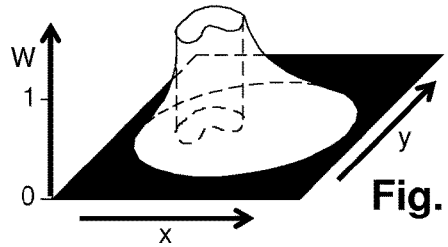
Fig. 7a
Fig. 7c
Fig. 7b
Fig. 7d

SHIMMING PROCEDURE THAT INCLUDES DETERMINATION OF THE TARGET FIELD BY OPTIMIZATION IN A PARAMETER SPACE OF REDUCED DIMENSIONALITY

This application claims Paris convention priority from DE 10 2013 220 933.9 filed Oct. 16, 2013, the entire disclosure of which is hereby incorporated by reference.

BACKGROUND OF THE INVENTION

The invention relates to a method for homogenizing the static magnetic field with a distribution B0(r) in the active volume of a magnetic resonance apparatus having a number N shim coils, wherein the method comprises the following steps:
 (a) Mapping the magnetic field distribution B0(r) of the static magnetic field,
 (b) Defining a target field distribution B0T(r),
 (c) Generating the target field distribution B0T(r) in the active volume by adjusting currents in the shim coils,
wherein an optimization procedure for optimizing a numerical quality criterion for the target field distribution B0T(r) is used in step (b),
wherein the optimization procedure supplies, as a result, values for the currents through the N shim coils,
and wherein a spatial weighting function is used in the optimization method.

Such a method is known from Markus Weiger, Thomas Speck, Michael Fey, "Gradient Shimming with Spectrum Optimization," Journal of Magnetic Resonance 182 (2006), 38-48 (=reference [5]).

Many magnetic resonance methods require static magnetic fields to be as homogeneous as possible, for example, in order to achieve a high spectral resolution in the case of a spectroscopic method or to achieve an image that is as free of distortions and as sharp as possible in the case of an imaging method. So-called shim coils are a known means for adjusting the homogeneity of the static magnetic field (see reference [2], for example), making available magnetic fields that are adjustable in the active volume in addition to the main magnetic field. Each of these shim coils is supplied with electric current from its own adjustable current source. A broad range of field distributions can be homogenized by means of the different field distributions generated by the various shim coils. Shim systems with up to 38 independent shim coils, or correspondingly the current sources, are already known.

In addition to the apparatus for generating the magnetic fields, a method for finding the suitable current setting is required. Such a method, by application of which the desired homogeneous magnetic field distribution in the working volume is achieved, is known as a shimming method. One particular difficulty with such methods involves the handling of the large number of degrees of freedom in the choice of the current setting. In particular, well-known shimming methods (for example, see reference [1]), that incrementally improve a measured variable used for capturing the global homogeneity, such as the amplitude, the signal energy or the second moment of a resonance line, by performing minor changes in each degree of current freedom, suffer from an enormous increase in the number of process steps required with an increase in the number of degrees of freedom.

A significant improvement in comparison with such a method is achieved when the shimming method takes into account information about the spatial distribution of the static magnetic field in the active volume. Information about the spatial distribution of the static magnetic field is obtained in a process step in which the magnetic field distribution B0(r) of the static magnetic field is mapped with the help of a suitable measurement method.

Known methods for adjusting the currents in the shim coils that are particularly efficient comprise the following steps:
 (a) Mapping the magnetic field distribution B0(r) of the static magnetic field,
 (b) Defining a target field distribution B0T(r)
 (c) Generating the target field distribution B0T(r) in the active volume by adjusting the currents through the shim coils.

Such a method is described in reference [4]:

The magnetic field distribution B0(r) is mapped in the active volume of the static magnetic field by means of a method based on phase-sensitive magnetic resonance imaging, the application of which uses switchable gradient coils for determining the spatial origin of the signals. Examples of such methods include the gradient-echo method and the spin-echo method.

A quality criterion whose optimum value (minimum or maximum) defines the target field distribution B0T(r) is used in defining the target field distribution B0T(r). A quality criterion derived from a simulated spectrum is used in the method according to reference [4]. Properties such as the full width at half height (FWHH) of spectral lines and envelope curves around spectral lines are determined on this predicted spectrum and are combined to form a variable, which serves as the target variable for an optimization algorithm. After the optimization algorithm has found an optimum for this target variable, the magnetic field distribution belonging to this optimum is defined as the target field distribution. Then in this method, the currents in the shim coils are adjusted iteratively and the effect achieved thereby is verified by renewed mapping of the magnetic field distribution in the active volume until the target field distribution is reached.

There are many known optimization algorithms suitable for finding the target field distribution. Options include the Gaussian-Newtonian method, the conjugated gradient method, the simplex method and the simulated annealing method. In general, there is an increase in the computation effort for discovering an optimum with a higher dimensionality of the parameter space, in this case with the number of shim coils or correspondingly the number of currents.

The most proximate prior art to the subject matter of the present invention is described in reference [5] cited in the introduction.

Here also, optimization of a quality criterion is performed to define the target field distribution, whereby a spatial weighting function is used in the optimization method. Efficient optimization is achieved by reducing the parameter space to one dimension. Optimization in a one-dimensional parameter space is implemented here, such that the measured magnetic field distribution B0(r) is subjected to a weighted fit with a spatial weighting function $W(r, k)=(B1(r))^k$ wherein the exponent k is changed. The fit functions here are the field distributions of the shim coils. The role of the single parameter is taken over by k. Each choice of the parameter k leads to a list of currents to be set for the shim coils and to a field distribution, which is close to a homogeneous distribution.

A small number of analyses (i.e., a small number of values for k) are often sufficient to find a very good solution, even when there is no guarantee that it will be the optimum solution. The advantage of this procedure is in avoiding the optimization with as many dimensions as there are shim coils in a high-dimensional parameter space.

A further problem with shimming methods is based on the fact that the approximation of a magnetic field distribution, as obtained by mapping the field distribution in the active volume, using a set of field distributions, such as those that can be created by the shim coils, generally leads to a mathematically ill-posed problem. The known approach of handling problems that are mathematically ill-posed is by regularization of the problems (see reference [6], for example).

These problems can be largely eliminated by means of regularization, where an attempt is made to prevent high-frequency oscillations with the smallest possible filter effect. One application for regularizing the shimming of MRI experiments is described in reference [3]. The shimming method described there is aimed at eliminating the numeric instabilities, which occur when an active volume that is not spherical and whose center is shifted with respect to the midpoint of the shim coils is to be shimmed using shim coils that are constructed such that the magnetic fields generated by them form an orthogonal function set in a spherical volume around a midpoint (see reference [3], column 1, lines 56-63).

In this case, if shimming is done using high-order functions (i.e., a large number of degrees of freedom of the current are determined), then even minor errors that occur due to measurement noise, for example, will affect the mapped magnetic fields, so that the result will be excessive shimming currents with opposite signs as an unusable solution, unless regularization is performed. Divergence of the currents can be prevented by using a regularization method.

Although the problems described in the last section with divergent currents may not occur in all cases, it is of great interest in general to find shim current settings that are economical with respect to shimming power. The reasons for this include preventing heating of the measurement system and of the sample volume by the neighboring shim coils. In addition, it is advantageous to operate the current sources with currents at sufficient distance away from hardware limitations. In addition to maximum values for the individual currents, the total power of the power supply for the current sources, as well as the temperature of electronic elements, are relevant limitations.

A restriction of the optimization to a one-dimensional parameter space, as described in reference [5] is too restrictive to take into account such hardware limitations in the current or power. However, explicitly taking these limitations into account in turn requires that the parameter space in its full size must be taken into account, which results in an optimization that is too time consuming.

One very primitive way to take into account current limitations consists simply of first calculating an optimization of the quality criterion without taking the limitation into account and then capping the individual currents for the shim coils at the respective maximum allowed value. As shown in reference [7], a better result can be achieved in general with the same limitations. The improvement proposed in reference [7] employs a minimization algorithm, that is tailored to the specific case of one positive limit and one negative limit for each individual shimming current and a quadratic dependence of the quality criterion on the shimming currents. As discussed above, more complex limitations such as shimming power also play a role in practice. Quality criteria, whose dependence on the shimming currents is different from a quadratic dependence, would also be desirable. In both of these cases, the algorithm can no longer be applied. Furthermore, the parameter space of the shim currents is taken into account in its full size in the minimization algorithm proposed in reference [7].

In contrast thereto, the application of a regularization method allows at least an indirect influence on the shimming power. However, the optimally regularized solutions do not provide any information about the quality of the shimming state as a function of the shimming current efficiency. There are often many other solutions that yield a comparable shimming quality but use much less power.

The present invention is thus based on the object of providing a method of the type defined in the introduction, in which the hardware limitations are taken into account in determining the target field distribution without any significant increase in the computation effort in optimization to determine the target field distribution.

In addition, the invention should have the effect that more points in the parameter space are tested to thereby reduce the probability that the proximity to the optimum solution is missed. The increase of the number of points in the parameter space shall be used to explore an independent direction.

SUMMARY OF THE INVENTION

This object is achieved in a surprisingly simple manner and with readily available technical means by modification of a method having the features defined in the introduction, characterized by the use of a filter method as the optimization procedure, in which a norm of the shimming currents is influenced by means of filter factors, and in that the optimization procedure operates in a parameter space with M control parameters, where 2≤M<N, where one of the control parameters is used as a weighting parameter for modification of a spatial weighting function, and where another control parameter controls the filter factor.

The goal of the invention as defined above is achieved in that the control parameter, which controls the norm of the shimming current, defines solutions in the full parameter space which can be calculated very rapidly. The ultimate solution is selected from a small number of experimental solutions, which are covered by the few (M) control parameters. Thus, with very little additional effort a particularly good solution is found, that minimizes the norm of the shimming currents.

The mechanism of action of the invention and additional advantages in comparison with the prior art are summarized below.

With the help of the method modified according to the invention, the distance of the resulting solutions from the hardware limitations can be influenced particularly in comparison with the most proximate prior art. The hardware limitations may be expressed in the form of a norm of the currents. This norm can be influenced in the direction of smaller values of the norm of the currents in a targeted manner by the choice of the control parameter that controls the filter factor in the filter method. This possibility of a targeted influence on the norm of the currents is missing entirely in the most proximate prior art.

In comparison with the older prior art, for example reference [4], in which the full dimensionality N (namely the number of shim currents) of the object is taken into account in the optimization step to define the target field distribution, the number of control parameters M can definitely be selected to be smaller than N in the method according to the invention and thus the computation effort can be reduced. The method according to the invention permits a reduction in the number of control parameters down to M=2.

In practice, the method according to the invention will be used on equipment in which the magnetic resonance apparatus is an NMR spectrometer, an MRI scanner, an EPR instrument or an ion cyclotron resonance apparatus. All of these instruments are used in a manner in which a very homogeneous magnetic field in a active volume is the prerequisite for an optimum measurement result. In addition, with these devices the possible settings of the magnetic field homogeneity by means of shim currents are always also limited due to the available hardware. While operating these devices, one can particularly benefit from the method according to the invention, as it achieves the best possible homogeneity of the magnetic field, taking into account these hardware limits.

Refinements of the method according to the invention that are particularly advantageous include those in which the magnetic resonance apparatus is an NMR spectrometer, in which a sample rotates about one or more axes, and the axes may be inclined with respect to the direction of the static magnetic field. Shimming systems for NMR spectrometers are usually designed such that an active volume having an axis of rotation parallel to the static magnetic field can be shimmed especially efficiently. If one deviates from this specimen geometry, currents in shim coils may be used inefficiently to influence the field homogeneity. The method according to the invention takes into account the norm of shimming currents and is thus capable of efficient use of shim coils, that were actually designed for a different sample geometry—in particular a sample geometry having a different axis of rotation.

In other advantageous embodiments of the method according to the invention, a gradient-echo method or a spin-echo method is used in step (a) for mapping the magnetic field distribution $B0(r)$ of the static magnetic field. These known imaging methods for imaging a magnetic field distribution allow mapping of the magnet field with the use of means already available in a magnetic resonance apparatus, i.e., transmitting/receiving coils and gradient coils. In this specific embodiment of the method according to the invention, no additional measurement capabilities are thus required to implement the method.

Specific embodiments of the invention, in which the adjustment range of the shim currents and the power consumed by all shim coils are taken into account in defining the target field distribution in step (b), are also especially preferred. The power consumed by all shim coils is a special case of a norm for shim currents, which has concrete technical significance for the operation of the measurement apparatus. On the one hand, it describes the heating power, which is dissipated in the shim coils and thus released in the vicinity of the active volume. Many magnetic resonance measurements depend on the temperature of the sample, so that an excess of heating power output in the vicinity of the active volume can have negative effects on a measurement. These negative effects are avoided by taking this effect into account already at the stage of selection of the target field distribution. On the other hand, the power consumed by all the shim coils is an important measure of the load on the power supply system, and this power consumption usually has a hardware-specific upper limit, that cannot be exceeded.

Most especially preferred are also specific embodiments of the method according to the invention, in which one of the following methods is used as the filter method in step (b):
Tikhonov regularization or
Tikhonov-Phillips regularization or
Truncated singular value decomposition or
Damped singular value decomposition.

The aforementioned methods are some of the most suitable known methods for handling so-called mathematically ill-posed problems. These methods utilize a single regularization parameter that defines the filter effect. Continuous increases in the value of the regularization parameter make it possible to find solutions in the full parameter space that correspond to an ever decreasing norm of the shim currents. Regularization methods in which the value of the regularization parameter can be varied continuously are particularly advantageous here.

Advantageous refinements of these specific embodiments are characterized in that the optimization procedure in step (b) optimizes a numerical quality criterion, and a calculation method is used for calculating the quality criterion, this calculation method using, as input, the static magnetic field $B0(r)$, the influence of the currents in the shim coils on the magnetic field as well as a weighting parameter and a regularization parameter, whereby the calculation method produces as output the quality criterion and a list of current settings, and the following steps are performed in the optimization procedure:

(i) Choosing a list of values for the first control parameter, the weighting parameter;
(ii) Choosing a list of values for a second control parameter, the regularization parameter;
(iii) Forming pairs of weighting parameters and regularization parameters from the list of values from (i) and the list of values from (ii) and calculating the quality criterion with input of this pair of weighting parameters and regularization parameters;
(iv) Evaluating whether the list of current settings is a current setting that can be implemented;
(v) Selecting the optimum pair of weighting parameters and regularization parameters on the basis of the quality criterion and with exclusion of current settings that cannot be implemented.

These advantageous refinements of the method according to the invention work with the minimum number of control parameters with which the idea according to the invention can be implemented, namely with M=2. The computational effort of the optimization needed for determining the target field distribution, inasmuch as it depends on the number of control parameters, is therefore reduced to the extent possible. Furthermore, in step (iv) an explicit check is performed on the adjustability of the currents for each result obtained from input of a pair of weighting parameters and regularization parameters. In this way, a list of conditions, which depend on the individual shimming currents in a complex manner, can also be taken into account in selecting the desired target field distribution.

Especially preferred variants of these refinements are characterized in that a simulated magnetic resonance spectrum is used in calculating the quality criterion. In application of the method to a spectroscopic method, the quality of the resulting spectrum is of primary concern. The connection between the magnetic field distribution in the space which is adjusted by the method according to the invention, and the resulting spectrum is established by the simulation of the spectrum. This procedure makes it possible to formulate the quality criterion in the language of the spectroscopist and also to take into account the properties of the sample that are relevant for the planned experiment, the measurement method used and its specific dependence on the homogeneity of the magnetic field.

An electronically readable data medium, on which a computer program is stored, also falls within the scope of the present invention, such that when the program is executed a method according to any one of the preceding claims is carried out. Such an electronically readable data medium is a particularly favorable means for enabling a user of a modern computer-controlled magnetic resonance apparatus to perform the method according to the invention.

Additional advantages of the invention are derived from the description and the drawings. Likewise, the features according to the invention that are mentioned above and those yet to be cited below may each be used individually or in arbitrary combinations. The specific embodiments illustrated and described here are not to be understood to be a definitive list but instead are given as examples in the description of the invention.

The invention is illustrated in the drawings and will be explained in greater detail with reference to the exemplary embodiments. They show:

BRIEF DESCRIPTION OF THE DRAWING

FIGS. 7a-d the creation of spatial weighting functions for the fit, derived from an MRI image, with
(a) MRI image recorded in preparation for the shimming procedure, wherein a region (71) selected by the user in which the highest homogeneity requirements are set, additional regions (72) having different signal strengths, represented by different hatching, and regions (73), wherein no signal was received;
(b) a spatial weighting function having values between 0 and 1 along the W axis for the fit in the shimming operation, wherein there is a uniform transition from full weight 1 in region 71 to weight 0 in region 73;
(c) a spatial weighting function with values between 0 and 1 along the W axis for the fit in the shimming operation, wherein the weighting function from FIG. 7b was raised to the power of k, and wherein 0<k<1, so that regions close to 71 have a greater weight;
(d) a spatial weighting function with values between 0 and 1 along the W axis for the fit in the shimming operation, wherein the weighting function from FIG. 7b has an exponent of k and wherein k>1, so that the weight drops rapidly for regions outside of 71;

DESCRIPTION OF THE PREFERRED EMBODIMENT

In performing the method according to the invention, the following steps are incorporated in a manner suitable for the task in an overall sequence which may include repetition of the steps and decisions about achieving a goal:
(a) Mapping the magnetic field distribution $B0(r)$ of the static magnetic field
(b) Defining a target field $B0T(r)$
(c) Generating the target field distribution $B0T(r)$ in the active volume by setting currents through the shim coils.

Figure 1:
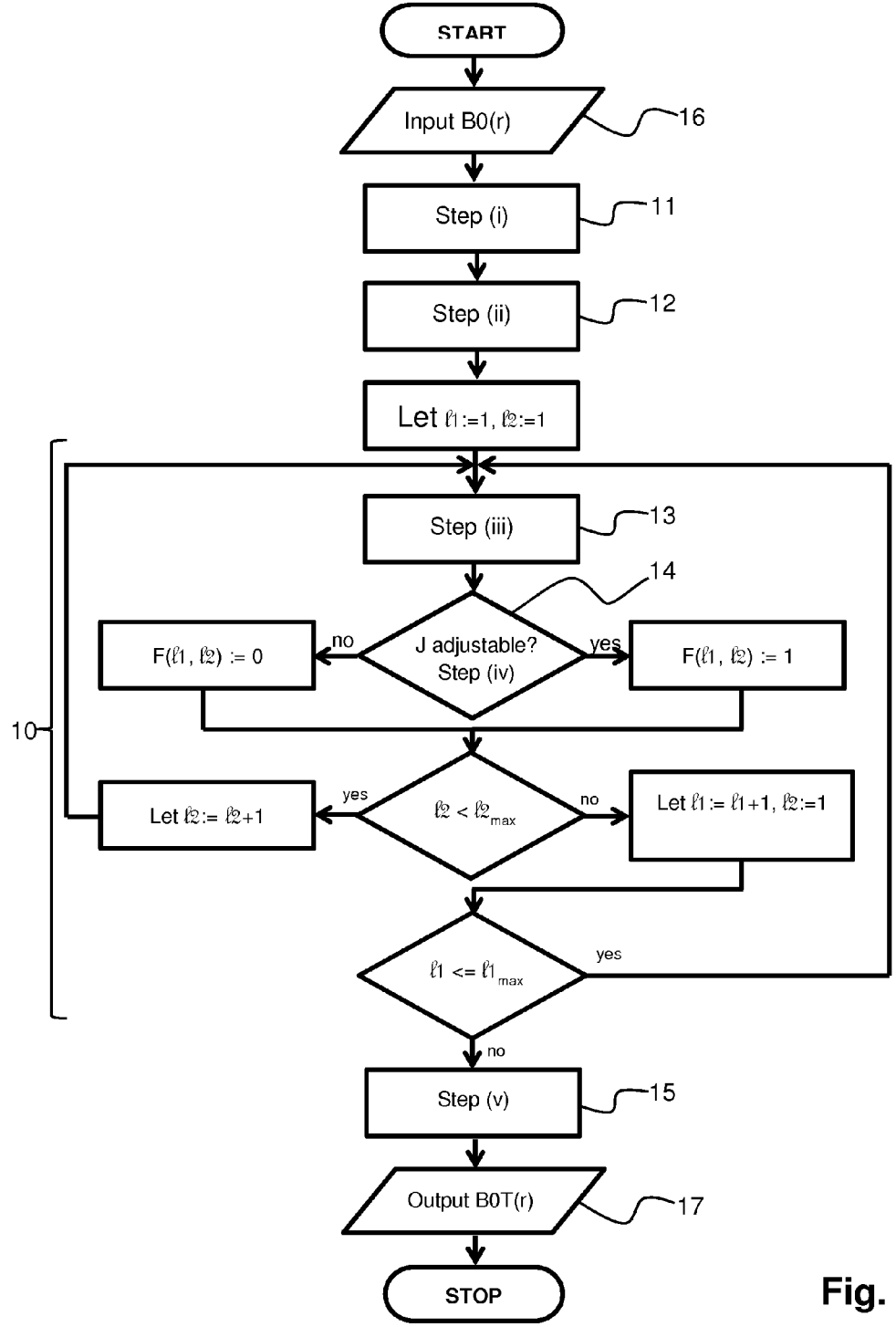
FIG. 1 a flow chart with optimization in a parameter space with M=2 control parameters.
Figure 2:
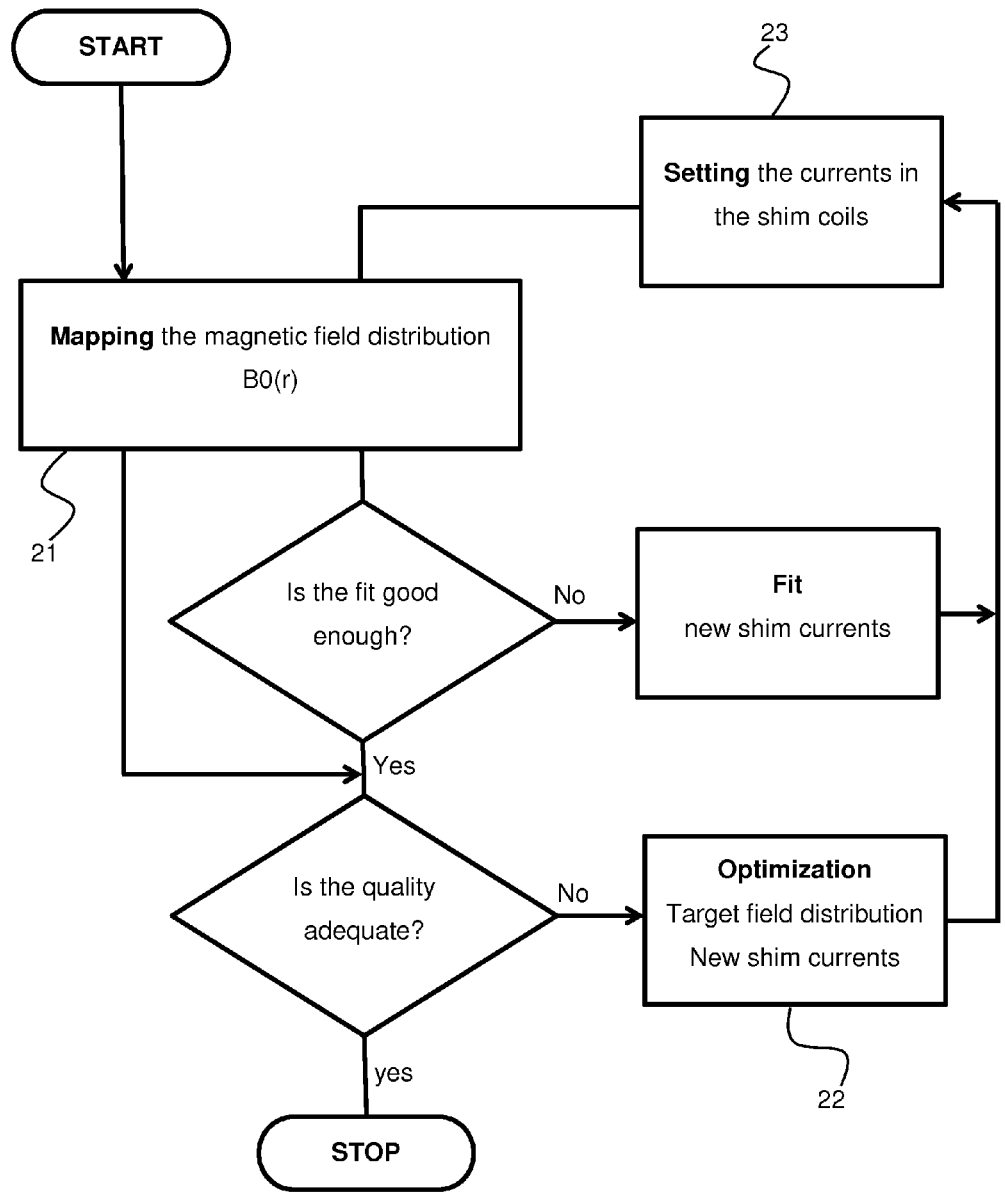
FIG. 2 a flow chart with a shimming method according to the prior art.
Figure 3:
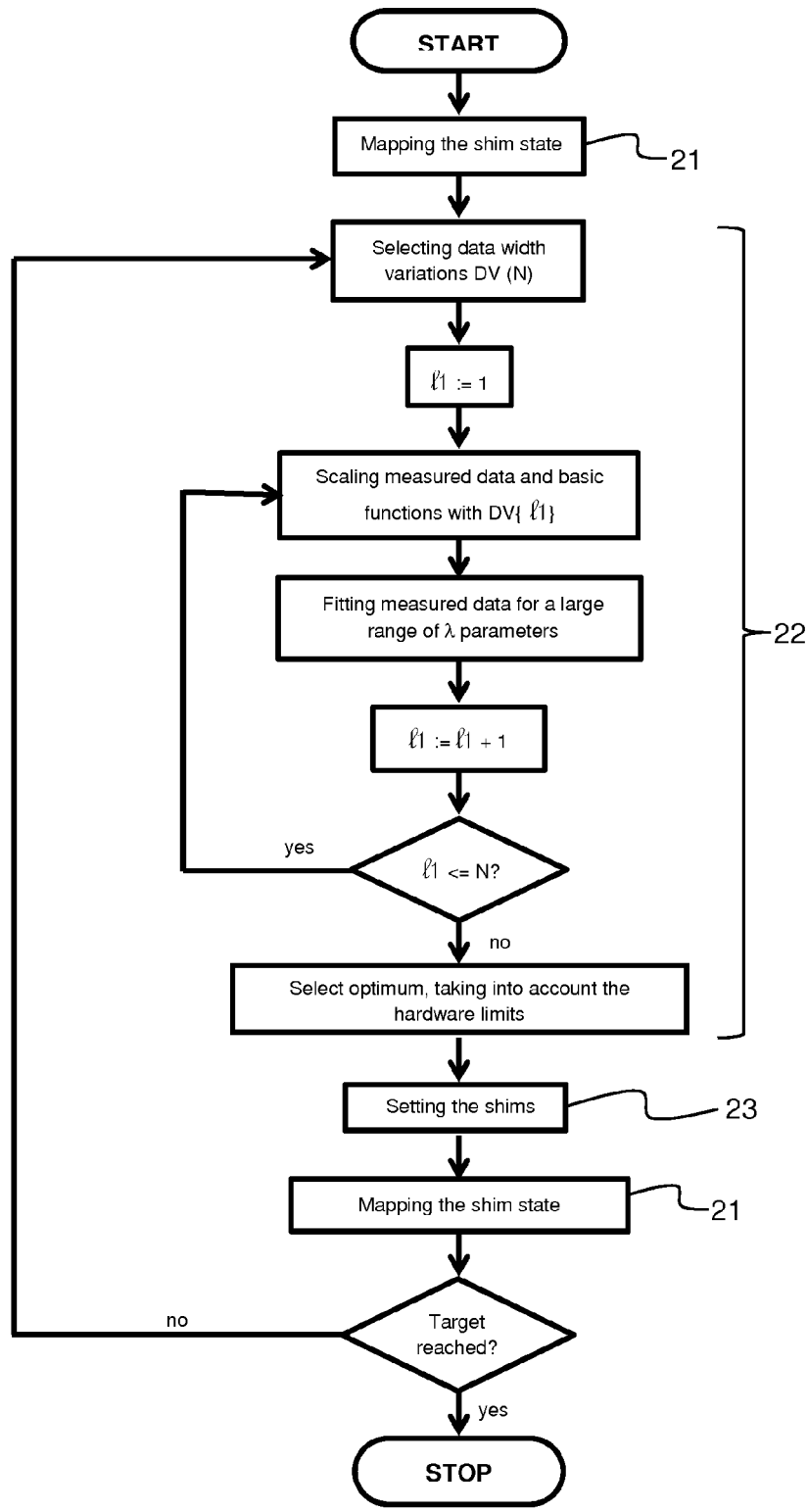
FIG. 3 a flow chart with a possible sequence of one variant of the method according to the invention.

One possible sequence is shown in FIG. 3 of the reference [5] (reproduced here in FIG. 2). This sequence includes an internal "fit loop" which has not been discussed previously here and in which only the difference between the prevailing magnetic field distribution $B0(r)$ and the target field distribution $B0T(r)$ is fitted, without defining any new target field distribution. Such a loop makes the method more robust for the case when the calculated change in current does not lead exactly to the precalculated change in the magnetic field distribution. Iterative readjustment without doing the work associated with defining a new target field distribution and the optimization required for it can greatly accelerate the entire process. Ultimately this loop is no longer necessary, if an accurate knowledge of the reaction of the entire measurement setup to changes in current in the shimming systems is achieved, and therefore it is not an obligatory component of the method according to the invention.

Various methods may be considered for mapping the magnetic field distribution in the active volume. Phase-sensitive magnetic resonance imaging methods which use switchable gradient coils, such as the gradient-echo method or the spin-echo method, are especially suitable for performing the mapping of the magnetic field distribution in the active volume. Information about the local magnetic field is obtained from the phase difference of the signals in two images recorded with a different evolution time for the spins.

The advantage of these methods is that mapping of the magnetic field can be performed using the same apparatus (i.e., transmitting/receiving coils, gradient coils) with which the experiment is performed for which homogenization of the magnetic field is a prerequisite. The sample that is ultimately used or the object to be imaged or the patient to be examined may be in the measurement position already, so that their influence on the homogeneity of the magnetic field can already be taken into account and corrected for.

Other known methods for measuring magnetic fields with spatial resolution use a displaceable magnetic field sensor, with which the magnetic field can be measured at different positions, or they use an array of magnetic field sensors. Hall sensors or small NMR probes are suitable here. Such a method may be used during the installation of a magnet for generating a basic homogeneity of the magnetic field, for example. After homogenization of the magnetic field, however, the displaceable magnetic field sensor must be replaced by a different measurement apparatus and, further, the sample to be examined must not be in the active volume during the mapping of the magnetic field.

In defining the target field distribution B0T(r), one or more quality criteria are used, from which a target variable whose optimum value (minimum or maximum) defines the target field distribution B0T(r) may be derived. One target variable, which may be used to define the target field distribution, is the root of the mean of the squared deviations from the constant ideal field (root mean squared deviation, RMSD).

This variable is not always suitable for ensuring the quality of the target field. This is the case, for example, with spectra where the highest possible resolution of the spectral lines must be achieved, and at the same time a split into closely adjacent lines that might be confused with multiplets must be avoided. In such a case, a method according to reference [4] is suitable, where the target function is calculated by analyzing a prediction of the resulting spectrum. Properties such as the half-width of spectral lines and of envelope curves around spectral lines are determined on this predicted spectrum and are combined to yield a variable, which serves as a target variable for an optimization algorithm.

This procedure of using a simulated spectrum makes it possible to formulate the quality criterion in the language of the spectroscopist as well as to explicitly take into account the properties of the sample that are relevant for the planned experiment, the measurement method used and its specific dependence on the homogeneity of the magnetic field. Possible quality criteria may include, for example, the full width at half height (FWHH), the width at another height or the half-value width of an envelope (as described in reference [4]) of a spectral line. The natural line width of the specimen to be examined is an important experimental parameter which, when set correctly, avoids inefficient homogenization on a scale that is too fine. Different pulse sequences, having different sensitivities to inhomogeneities in the magnetic field, may be used on the same apparatus. This effect can also be taken into account during simulation of the spectrum.

Another quality criterion that is particularly useful in evaluating homogeneity in MRI images is obtained by squaring the local gradient of the magnetic field (gradient of all three directions in space) and adding them up over all voxels. By minimizing the resulting value, the entire signal is maximized inasmuch as it depends on the homogeneity of the magnetic field in that the intravoxel dephasing caused by local gradient is minimized.

The decisive feature of the present invention is the optimization in a parameter space using M control parameters, where $2 \leq M < N$, for the determination of the target field distribution B0T(r). At least one of the control parameters, the weighting parameter, is used for modification of a spatial weighting function. This parameter serves to find possible solutions in the parameter space of the shim currents with a high dimensionality by varying the relative weighting of subareas in the measurement data.

One possible implementation of such a weighting parameter is given in reference [5] using the parameter k:

A k-dependent weighting function $W(r, k)=(B1(r))^k$ is constructed, based on the normalized RF excitation profile B1(r). The effect of the choice of k is that with k=1, the weighting of the excitation profile is accepted unchanged, with 0<k<1, the edge of the excitation profile is weighted more strongly, and with k>1, the edge of the excitation profile is attenuated in the fit.

Figure 8A:
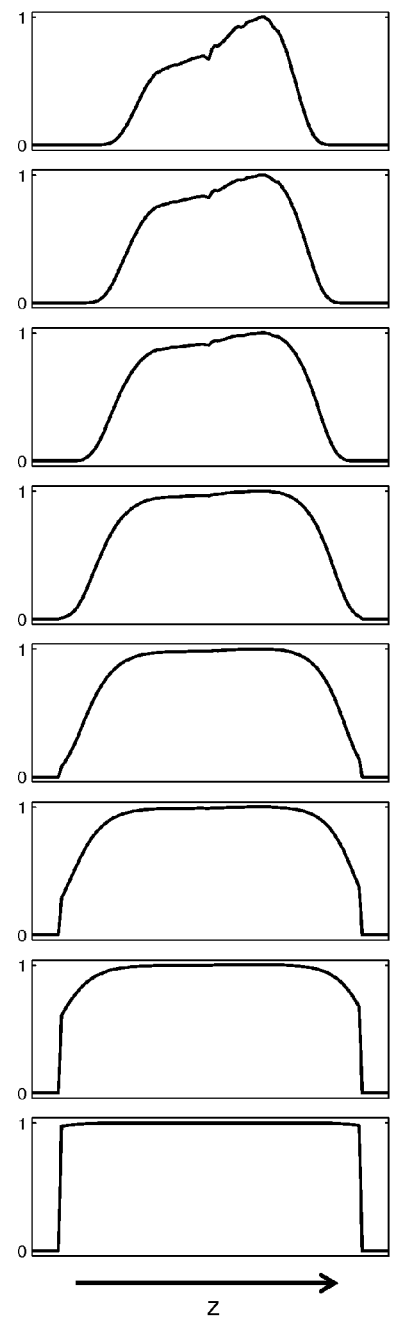
FIGS. 8a, b additional possibilities of varying the spatial weighting functions with one parameter, namely
(a) varying the spatial weighting function for the fit in the form of $(B1(r))^k$, where k assumes the following values from bottom to top: 0.01, 0.2, 0.5, 1, 2, 5, 10, 20.

The local effect of k depends on the value of the excitation profile at the respective position. The choice of a spatial weighting function that strongly resembles on the form of the excitation profile of the RF coil is particularly suited in the case of a spectroscopic method, in which a homogeneous specimen is analyzed. In this case, the differential treatment of the regions in the sample, that contribute greatly toward the received signal, and regions in the sample, that are at the edge of the excitation signal and make only weak contributions and that potentially suffer from measurement artifacts, is important. FIG. 8a shows a range of such weighting functions generated with variation of the exponent k from the measurement excitation profile B1(z).

Another possibility for obtaining a variation in the solutions by means of the weighting function in the fitting procedure is achieved when a measured excitation profile is scaled with a function that modulates the effective width of the signal. This function is also taken into account in analysis of the scaled data.

Figures 4A, 4B:
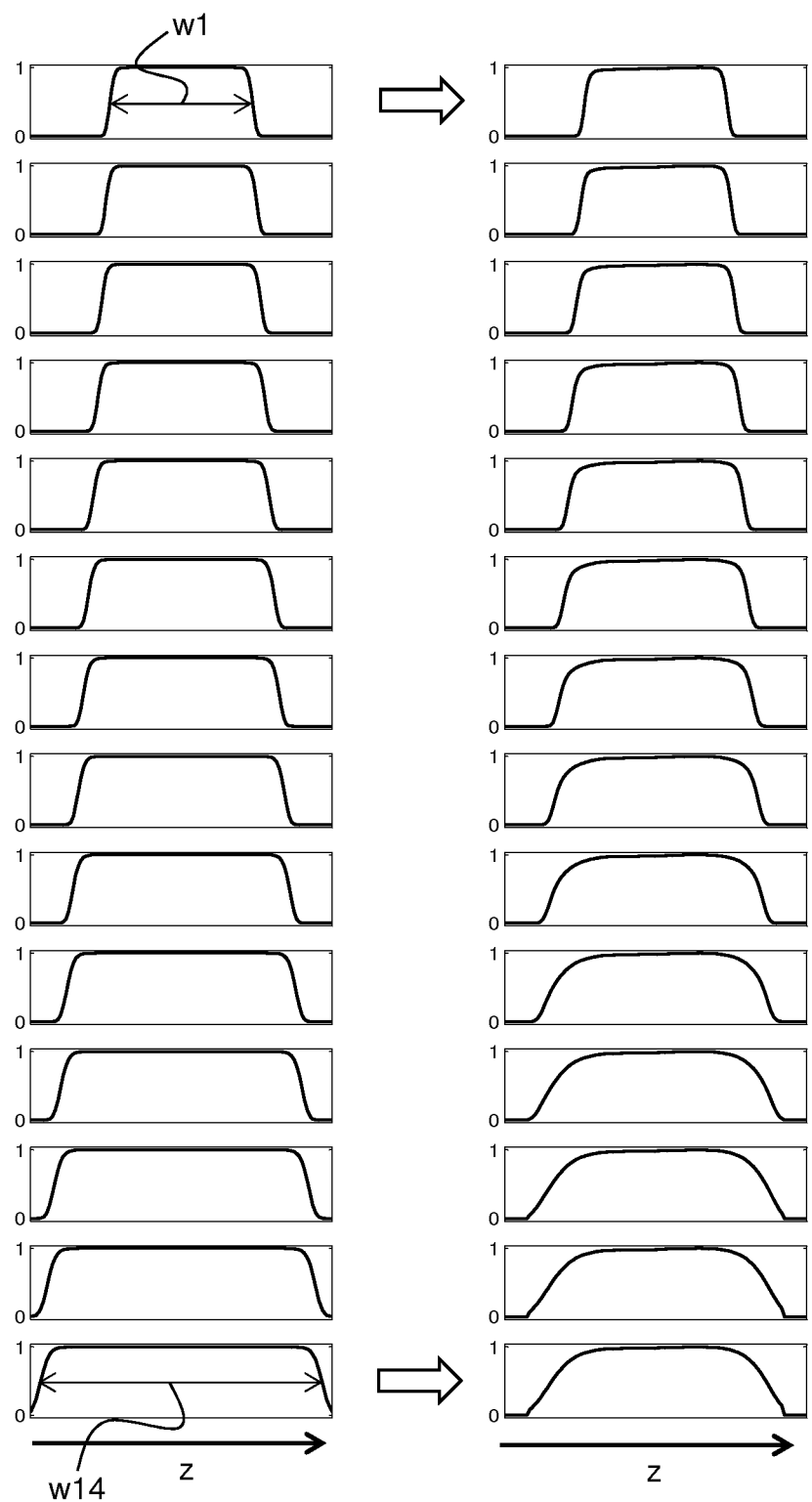
FIGS. 4a, b the construction of a set spatial weighting functions for the fit with a varying data width, with
(a) functions for varying the data width, so that weighting functions in FIG. 4b are obtained by scaling the measured excitation profile with these functions;
(b) in each row the excitation profile scaled with the corresponding functions from FIG. 4a, which is used as a weighting function in the fit.

FIG. 4b shows how a set of weighting functions can be generated from a measured excitation profile, by means of the 14 different functions, which serve to vary the data width as shown in FIG. 4a.

Figure 5A:
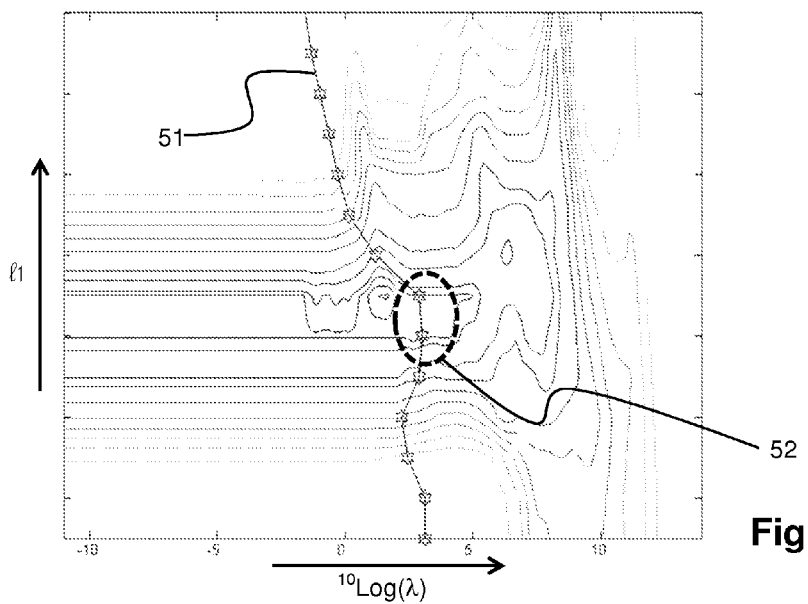
FIGS. 5a, b the illustration of the optimization of the quality criterion in a two-dimensional parameter space, with
(a) 2D plot of the quality criterion for the shimming state versus log regularization parameter (horizontally) and data width (vertically);
(b) 2D plot of the quality criterion for the shimming state versus log of the 2-norm of the shim currents (horizontally) and data width (vertically)
Figure 5B:
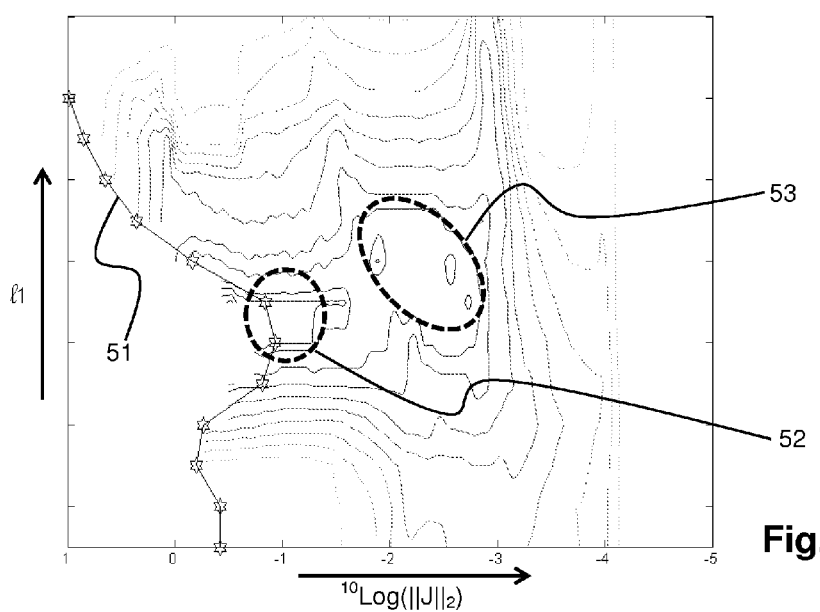

A result is achieved by means of an efficient linear analysis, as shown in FIGS. 5a and 5b, from which the best solution is then selected. The axial direction l1 in these figures denotes the direction in which the data width is varied.

Figure 8B:
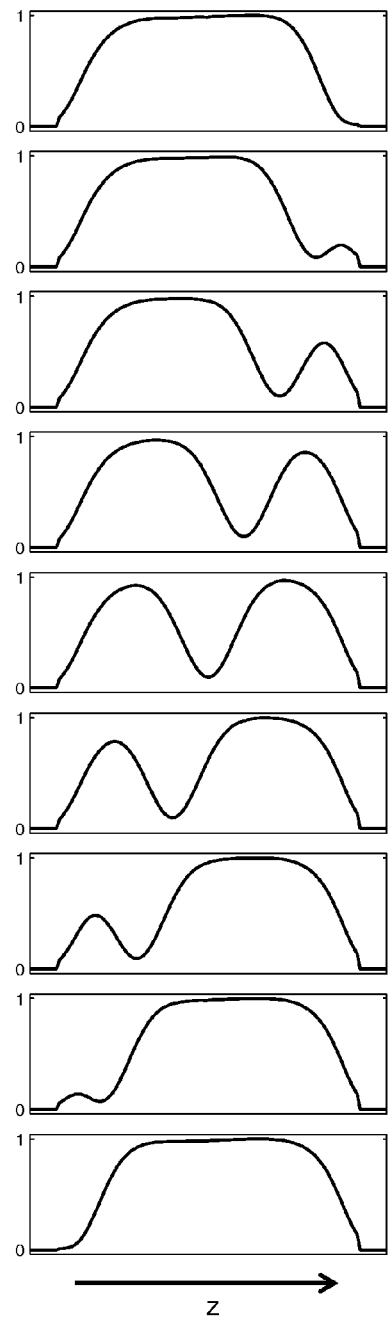
FIG. 8b variation of the spatial weighting function for the fit where the z position of a place of reduced weight is varied.

A third possibility for varying the spatial weighting function is beneficial in cases where the fit result is greatly influenced by a localized distortion of the magnetic field distribution. Instead of varying the width of the distribution as above, the spatial position of a zone in which the weighting function is to be reduced locally is to be varied. FIG. 8b shows a set of such functions.

In the case of imaging applications, it is necessary to choose a spatial weighting function, which takes into account the spatial arrangement of the objected to be imaged. A suitable weighting function can be derived, for example, based on an image recorded in preparation and a region therein marked by the user in which the highest homogeneity requirements are set. Such a region may be an organ of a patient to be examined, for example.

A compromise between global homogeneity in the entire image and local homogeneity in the selected region can be found through a parameter, which has a continuous influence on the weighting function. One such parameter can be used as the first dimension in the optimization in step (b) of the shimming method. FIGS. 7b, 7c and 7d show a set of weighting functions constructed in this way, which fit with the MRI image represented schematically in FIG. 7a.

Another control parameter controls the filter factors of the filter method in which a norm of the shim currents is influenced by means of these filter factors. The norm of the shim currents thereby influenced may be, for example, the total power of all shim coils.

The norm of the shim currents is thereby influenced indirectly. The term "indirect influence" here means that the precise value of the norm of the shim currents may not be specified directly but, starting with a solution to a parameter value, a solution whose norm is less than or greater than the starting value can be found in a targeted manner by choosing a greater or smaller value for the control parameter that controls the filter factors.

A suitable parameter is the regularization parameter of a regularization method in which the following methods may be used as regularization methods: for example, discretization, truncated singular value decomposition (TSVD), damped singular value decomposition (DSVD), Tikhonov regularization, Tikhonov-Phillips regularization (see reference [6]). With a norm of the shim currents, the entire list of currents in the N shim coils is combined into a single characteristic value.

If the power is of primary interest, then the norm is formed as the root of the total of squares of the shimming currents (the "2-norm"), if need be with a weighting that corresponds to the different resistances of the shim coils.

If the sum of the currents is important as a limiting variable, then as an alternative the sum of the amounts of the currents (the "1-norm") may also be taken into account.

The maximum norm is the suitable variable if one wants to avoid extreme loads on individual shim coils.

A very efficient implementation of the method is achieved by utilizing the regularization parameter λ from the Tikhonov method to achieve solutions, which have a steadily declining shimming power with an increase in the value of λ.

Let $$K = UWV^T$$

be the singular value decomposition of the set of shim functions K, then the solution g of the linear analysis of the mapped data s can be written according to the least squares method as $$g = \sum_{l_2} \frac{1}{w_{l_2}} v_{l_2} u_{l_2}^T s$$

where the singular values $w_{l_2}$ are sorted according to decreasing size so that $w_1$ is the largest singular value and $w_N$ is the smallest singular value, where N is the number of available shim functions. The singular values $w_{l_2}$ typically decline very rapidly with an increase in the index l2 and are responsible for the numerical problems which must be regularized.

In the Tikhonov regularization, the parameter λ has a filter effect, which is described by the equation $$g = \sum_{l_2} \frac{w_l}{(w_{l_2}^2 + \lambda)} v_{l_2} u_{l_2}^T s$$

However, this equation can also be used to efficiently find solutions in the highly complex parameter space by performing analyses using different values for λ. It is also a major advantage that λ can be varied with any desired precision, which is not possible for all regularization methods.

A two-dimensional representation of the shimming quality as a function of the data width and the parameter λ, achieved from a mapped magnetic field distribution B0(r) in the active volume of the static magnetic field, is shown in FIG. 5a on the basis of one practical example of an NMR probe.

Figure 6:
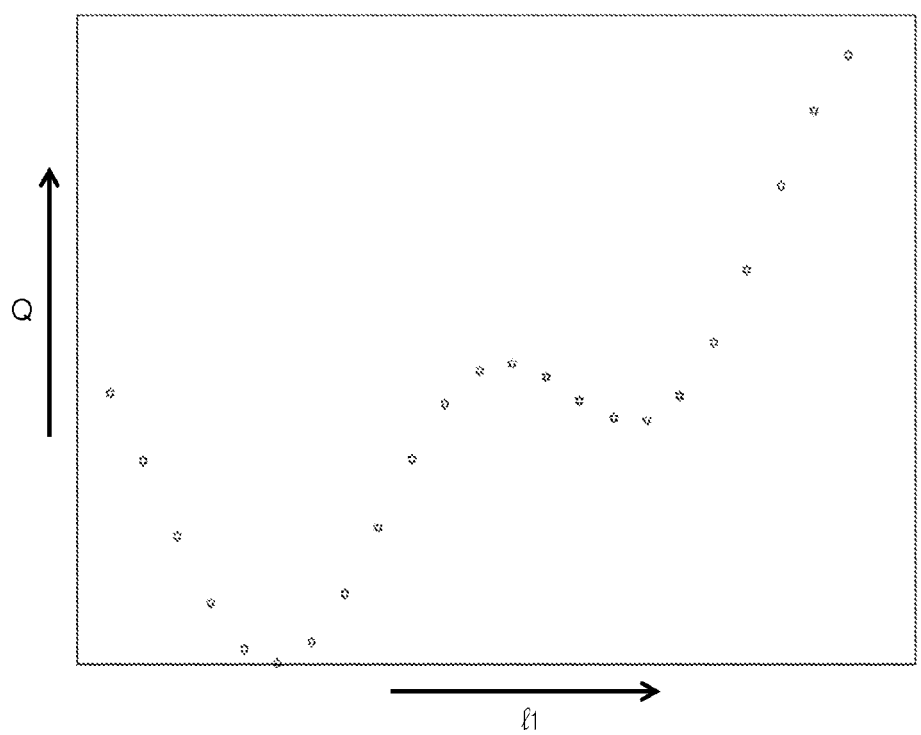
FIG. 6 the quality criterion (Q) for the shimming state as a function of the data width for solutions obtained by optimum regularization ("discrepancy principle" or L-plot)

Conventional procedures in regularization methods to determine the optimum value of λ such as the "discrepancy principle" or L-plot yield a result as shown in FIG. 6 and/or also in FIGS. 5a and 5b by means of hexagonal symbols. These places are optimized in order to eliminate the numerical problems with the smallest possible increase in the deviation, i.e., with a minimal filter effect.

However, at the optimum value of parameter λ, the solution that achieves an almost optimal result with the least possible shimming power is not found.

FIG. 5b shows what is found with the same data if the required shimming power is evaluated for each parameter λ and the corresponding data point is plotted in a diagram with shimming power as the horizontal axis. The two-dimensional space often makes it possible to find solutions of a similar quality at significantly lower shimming powers, such as that found with the discrepancy principle, for example. In the example shown here, this yields solutions which save on shimming power in comparison with the regularized solution by up to two orders of magnitude.

A relatively small selection of points in the two-dimensional space is often sufficient to determine a local optimum and to achieve the requirements. One important point in the selection is to take into account known hardware limits before setting the shims and testing experimentally whether the expected shim state is achieved.

This can save a great deal of time. This mechanism is a great advantage in complex problem situations in particular where the algorithm yields solutions that exceed the hardware limits. In particular the second parameter, the regularization parameter, indicates the direction in which one must seek a solution that does not exceed the hardware limits.

Problems in which there is an increased risk of exceeding the hardware limits include, for example, highly inhomogeneous samples or samples in short containers (for example, MAS rotors).

One concrete implementation of the method according to the invention is illustrated in FIG. 3 as a flowchart. In this case, the data width was selected as a weighting parameter. A second control parameter for the optimization here is the regularization parameter λ of the Tikhonov regularization. The sequence includes the following steps:

(a) Mapping the magnetic field distribution B0(r) in the active volume of the static magnetic field,
(b) Making a choice of data width variations which are taken into account in scaling the theoretical shimming functions,
(c) Fitting the magnetic field distribution B0(r) with the scale shimming functions for all data width variations and for multiple values of λ,
(d) Defining a target field distribution B0T(r) in the active volume which corresponds to the requirement for a good shim status with a low shimming power,
(e) Generating the target field distribution B0T(r) in the working volume by setting currents through the shim coils,
(f) Mapping the magnetic field distribution B0(r) in the active volume of the static magnetic field,
(g) Repeating steps (b)-(f) until the target field distribution B0T(r) in the active volume is approximately reached.

Main Fields of Application

The method according to the invention may be used with all known magnetic resonance apparatuses, such MRI scanners, NMR spectrometer or EPR devices, for example, but it is particularly advantageous with high resolution spectroscopy, where the goal, namely to achieve the narrowest possible line form, free of spikes, is often not achieved by minimizing the norm of the target field distribution B0T(r).

The method according to the invention may be used to particular advantage for homogenization of the static magnetic field in the working volume of a magnetic resonance apparatus, where the magnetic resonance apparatus is an NMR spectrometer, an MRI scanner, an EPR instrument or an ion cyclotron resonance apparatus.

Inclined Axis of Rotation

Methods of NMR spectroscopy in which a sample rotates about an axis, which is inclined with respect to the direction of the static magnetic field, require a high homogeneity of the magnetic field along this inclined axis or axes of rotation. Magic angle spinning (MAS), variable angle spinning (VAS) and double rotation (DOR) are examples of such methods. These methods may suffer from the fact that the shim coils are designed for having an efficient influence on the field distribution on an axis parallel to the static magnetic field. Such methods benefit in particular from a shimming procedure according to the invention that takes into account the shimming quality and the shimming power required to achieve it.

The method according to the invention is also preferred for use to homogenize the static magnetic field in the active volume of a magnetic resonance apparatus, where the magnetic resonance apparatus is an NMR spectrometer, in which a sample is rotated about one or more axes which may also be inclined with respect to the direction of the static magnetic field.

Computer Program

All the procedures involved in operating modern magnetic resonance spectrometers and MRI scanners, such as sending RF pulses, switching currents in gradients, adjusting shim currents and receiving and digitizing signals today are deployed under computerized control. The shimming procedure according to the invention is therefore ideally implemented as a computer program, which directly deploys the required actions on the hardware when implemented on the control computer of the magnetic resonance spectrometer or the MRI scanner. To users of the spectrometer, such a program is sent simply on an electronically readable data medium containing a computer program, which, when executed, executes the method according to the invention.

LIST OF REFERENCE NUMERALS

10 Two entangled loops with counters 11 and 12
11 Step (i): selection of a list of values for a first control parameter, the weighting parameter; select a list $\{k(1), \ldots, k(l1_{max})\}$ of weighting parameters.
12 Step (ii): select a list of values for a second control parameter, the regularization parameter; select a list $\{\lambda(1), \ldots, \lambda(l2_{max})\}$ of regularization parameters.
13 Step (iii): forming pairs of weighting parameters and regularization parameters from the list of values from (i) and the list of values from (ii) and calculating the quality criterion with input of this pair of weighting parameters and regularization parameters; the current parameter pair is $\{k(l1), \lambda(l2)\}$; calculate the quality criterion $Q(l1, l2)$ and the associated current setting $J(l1, l2)$.
14 Step (iv): evaluating whether the list of current settings is a feasible current setting; decision as to whether J is adjustable. If so, set $F(l1, l2)=1$, otherwise $F(l1, l2)=0$.
15 Step (v): selecting the optimum pair of weighting parameters and regularization parameters on the basis of the quality criterion and excluding current settings that are not feasible; $l1_{opt}, l2_{opt}$, so that $Q(l1_{opt}, l2_{opt})$ is minimal under the secondary condition that $F(l1_{opt}, l2_{opt})=1$. The magnetic field calculated from $B0(r)$ and $J(l1_{opt}, l2_{opt})$ is the target field distribution $B0T(r)$.
16 Input of $B0(r)$.
17 Output of $B0T(r)$.
21 Step in the shimming procedure: mapping the magnetic field distribution $B0(r)$ of the static magnetic field.
22 Step in the shimming procedure: definition of a target field distribution $B0T(r)$.
23 Step in the shimming procedure: creating the target field distribution $B0T(r)$ in the working volume by setting currents through the shim coils.
51 Curve in the 2D plot on which solutions obtained by optimum regularization ("discrepancy principle" or L plot) are located.
52 Region of optimum values for the quality criterion found in the search along 51.
53 Additional solutions with similar values for the quality criterion and lower shimming power than in 52.
71 Region in the MRI image that should achieve the greatest possible homogeneity after shimming.
72 Remaining region in the MRI image, having a signal strength greater than zero.
73 Region in the MRI image that does not contain any signal and need not be taken into account in shimming.
l1 Axial direction of the data width in the 2D plot
Q Axial direction of the quality criterion
W Axial direction of the function value for weighting function
w1 Data width of the first weighting function
w14 Data width of the fourteenth weighting function
x Spatial x direction (in the MRI image)
y Spatial y direction (in the MRI image)
z Spatial z direction (at weighting functions)
λ Regularization parameter (lambda)

LIST OF REFERENCES

[1] Richard R. Ernst:
"Measurement and Control of Magnetic Field Homogeneity"; The Review of Scientific Instruments 39 (1968) 998-1012
[2] R. E. Gang:
U.S. Pat. No. 3,287,630
[3] Dong-Hyun Kim, Daniel M. Spielman, Gary H. Glover, Elfar Adalsteinsson:
U.S. Pat. No. 6,529,002
[4] Markus Weiger, Michael Fey, Thomas Speck:
EP 1 662 270 B1
[5] Markus Weiger, Thomas Speck, Michael Fey:
"Gradient shimming with spectrum optimization"; Journal of Magnetic Resonance 182 (2006) 38-48
[6] P. C. Hansen:
"Rank-Deficient and Discrete Ill-Posed Problems"; SIAM, Philadelphia, 1998
[7] Han Wen, Farouc A. Jaffer:
"An in-vivo Automated Shimming Method Taking into Account Shim Current Constraints"; Magnetic Resonance in Medicine 34 (1995) 898-904

We claim:

1. A method for homogenizing a static magnetic field having a distribution $B0(r)$ in an active volume of a magnetic resonance apparatus, the magnetic resonance apparatus having a number N of shim coils, the method comprising the steps of:
   a) mapping the magnetic field distribution $B0(r)$ of the static magnetic field;
   b) defining a target field distribution $B0T(r)$ using an optimization procedure to optimize a numerical quality criterion for the target field distribution $B0T(r)$, the optimization procedure supplying values for currents through the N shim coils, wherein a spatial weighting function is used in the optimization procedure, the optimization procedure further comprising a filter method in which a norm of the currents in the shim coils is influenced by means of filter factors, wherein the optimization procedure works in a parameter space having M control parameters with $2 \leq M < N$, one of the control parameters being used as a weighting parameter for modification of a spatial weighting function, wherein an additional control parameter controls the filter factors; and c) generating, following step b), the target field distribution $B0T(r)$ in the active volume by setting the currents in the shim coils.

2. The method of claim 1, wherein an NMR spectrometer, an MRI scanner, an EPR instrument or an ion cyclotron resonance apparatus is used as the magnetic resonance apparatus.

3. The method of claim 2, wherein the magnetic resonance apparatus is an NMR spectrometer in which a sample is rotated about one or more axes.

4. The method of claim 3, wherein the axes are inclined with respect to a direction of the static magnetic field.

5. The method of claim 1, wherein in step (a), a gradient-echo method or a spin-echo method is used for mapping the magnetic field distribution $B0(r)$ of the static magnetic field.

6. The method of claim 1, wherein, in defining the target field distribution in step (b), an adjustment range of currents in the shim coils and power consumed by all the shim coils are taken into account.

7. The method of claim 1, wherein the filter method used in step (b) includes one of Tikhonov regularization, Tikhonov-Phillips regularization, truncated singular value decomposition and damped singular value decomposition.

8. The method of claim 7, wherein the optimization procedure optimizes a numerical quality criterion in step (b) and a calculation method is used to calculate the quality criterion, wherein the calculation method uses as input the static magnetic field $B0(r)$, the influence of the currents in the shim coils on the magnetic field, a weighting parameter and a regularization parameter, the calculation method outputting the quality criterion and a list of current settings, wherein the optimization procedure comprises the steps of:

i) selecting a list of values for a first control parameter, wherein the first control parameter is the weighting parameter;

(ii) selecting a list of values for a second control parameter, wherein the second control parameter is the regularization parameter;

(iii) forming pairs of weighting parameters and regularization parameters from the list of values from (i) and the list of values from (ii) and calculating the quality criterion with input of those pairs of weighting parameters and regularization parameters;

(iv) evaluating whether a list of current settings comprises feasible current settings; and (v) selecting an optimum pair of weighting parameters and regularization parameters on a basis of the quality criterion, while excluding non-feasible current settings.

9. The method of claim 8, wherein a simulated magnetic resonance spectrum is used in calculation of the quality criterion.

10. An electronically readable non-transitory data medium on which a computer program is stored, that computer program containing instructions for executing the method of claim 1.

* * * * *